(12) United States Patent
Tångring et al.

(10) Patent No.: US 9,331,238 B2
(45) Date of Patent: May 3, 2016

(54) SEMICONDUCTOR LAYER SEQUENCE, OPTOELECTRONIC SEMICONDUCTOR CHIP AND METHOD FOR PRODUCING A SEMICONDUCTOR LAYER SEQUENCE

(75) Inventors: Ivar Tångring, Regensburg (DE); Martin Rudolf Behringer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/348,587

(22) PCT Filed: Aug. 22, 2012

(86) PCT No.: PCT/EP2012/066318
§ 371 (c)(1),
(2), (4) Date: Jun. 26, 2014

(87) PCT Pub. No.: WO2013/045178
PCT Pub. Date: Apr. 4, 2013

(65) Prior Publication Data
US 2014/0326948 A1    Nov. 6, 2014

(30) Foreign Application Priority Data

Sep. 29, 2011  (DE) .......................... 10 2011 115 312

(51) Int. Cl.
*H01L 33/06* (2010.01)
*H01L 33/00* (2010.01)
*H01L 33/30* (2010.01)
*H01S 5/343* (2006.01)
*B82Y 20/00* (2011.01)
*H01L 33/12* (2010.01)
*H01L 33/08* (2010.01)

(52) U.S. Cl.
CPC ............... *H01L 33/06* (2013.01); *B82Y 20/00* (2013.01); *H01L 33/0062* (2013.01); *H01L 33/12* (2013.01); *H01L 33/30* (2013.01); *H01L 33/305* (2013.01); *H01S 5/34326* (2013.01); *H01L 33/08* (2013.01)

(58) Field of Classification Search
CPC ...................................................... H03L 33/06
USPC .............................................. 257/13; 438/47
See application file for complete search history.

(56) References Cited

U.S. PATENT DOCUMENTS 6,486,491 B1 * 11/2002  Najda ............................ 257/18
6,504,171 B1    1/2003  Grillot et al.
(Continued)

FOREIGN PATENT DOCUMENTS

EP    1081817 A2    3/2001
EP    2144278 A2    1/2010

*Primary Examiner* — Edward Wojciechowicz
(74) *Attorney, Agent, or Firm* — McDermott Will & Emery LLP

(57) ABSTRACT

In at least one embodiment, the semiconductor layer sequence (1) is provided for an optoelectronic semiconductor chip (10). The semiconductor layer sequence (1) contains at least three quantum wells (2) which are arranged to generate electromagnetic radiation. Furthermore, the semiconductor layer sequence (1) includes a plurality of barrier layers (3), of which at least one barrier layer is arranged between two adjacent quantum wells (2) in each case. The quantum wells (2) have a first average indium content and the barrier layers (3) have a second, smaller, average indium content. A second average lattice constant of the barrier layers (3) is thereby smaller than a first average lattice constant of the quantum wells (2).

15 Claims, 2 Drawing Sheets

(56) References Cited

U.S. PATENT DOCUMENTS

Figure 3A:
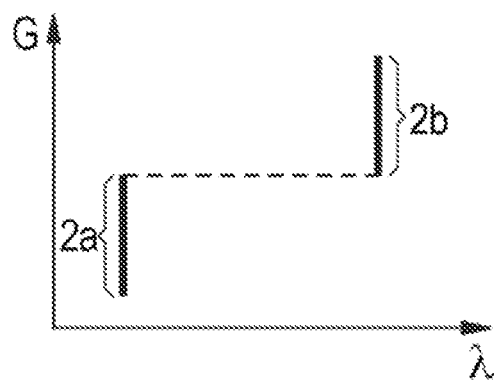

| | | | |
|---|---|---|---|
| 2004/0090779 A1* | 5/2004 | Ou et al. | 362/231 |
| 2007/0007541 A1 | 1/2007 | Kim et al. | |
| 2007/0262293 A1* | 11/2007 | Fujikura | 257/13 |
| 2009/0206322 A1* | 8/2009 | Brandes | 257/13 |
| 2010/0009484 A1* | 1/2010 | Akita et al. | 438/46 |

* cited by examiner

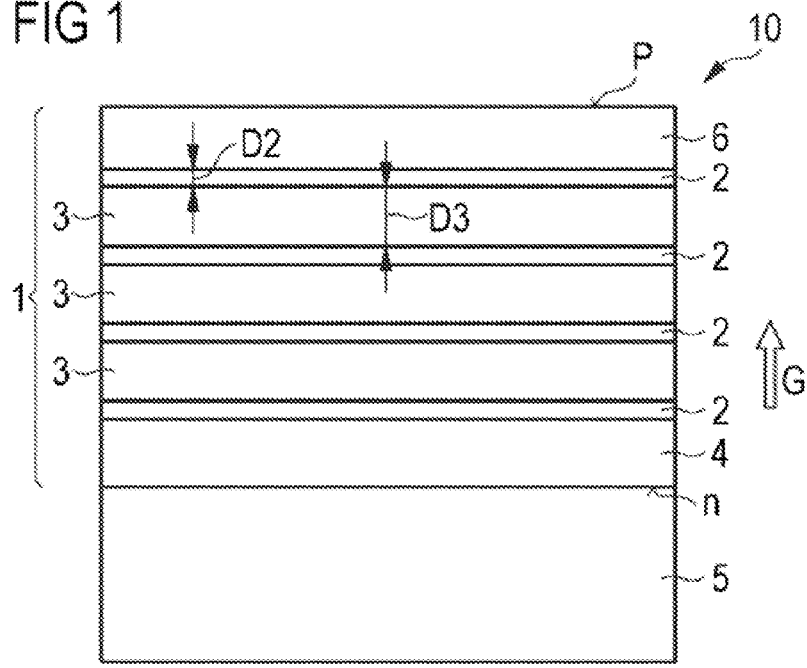
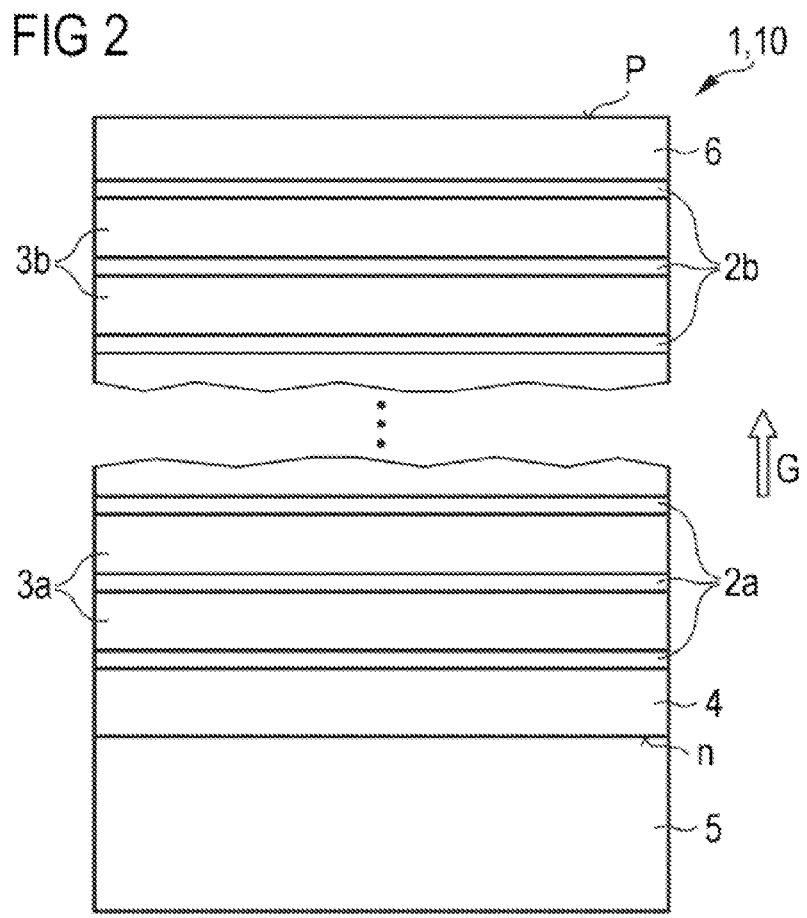

SEMICONDUCTOR LAYER SEQUENCE, OPTOELECTRONIC SEMICONDUCTOR CHIP AND METHOD FOR PRODUCING A SEMICONDUCTOR LAYER SEQUENCE

A semiconductor layer sequence is provided. Furthermore, a method for producing such a semiconductor layer sequence and an optoelectronic semiconductor chip comprising such a semiconductor layer sequence are provided.

An object to be achieved resides in the provision of a semiconductor layer sequence and an optoelectronic semiconductor chip having such a semiconductor layer sequence, wherein the semiconductor layer sequence has a high emission wavelength stability with respect to changes in temperature.

In accordance with at least one embodiment of the semiconductor layer sequence, this is provided for an optoelectronic semiconductor chip. The semiconductor layer sequence is then preferably arranged to be used in a photodiode, a light-emitting diode or a laser diode.

The semiconductor layer sequence is preferably based on a III-V-compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or even an arsenide compound semiconductor material such as $Al_n In_{1-n-m} Ga_m As$, wherein in each case $0 \leq n \leq 1$, $0 \leq m \leq 1$ and $n+m \leq 1$. The semiconductor layer sequence can thereby contain dopants and additional elements. However, for the sake of simplicity, only the essential elements of the crystal lattice of the semiconductor layer sequence, i.e., Al, As, Ga, In, N or P, will be described, even if these can be partly replaced and/or supplemented by small amounts of further substances.

In accordance with at least one embodiment of the semiconductor layer sequence, this comprises at least one, particularly preferably at least three, quantum wells. The quantum wells are arranged to generate electromagnetic radiation. The term "quantum well" does not have any significance with respect to the dimensionality of the quantisation. It thus includes inter alia structures having a quantisation in one, two or three spatial directions and any combination of these structures.

In accordance with at least one embodiment of the semiconductor layer sequence, the at least three quantum wells are arranged one above the other in a direction of growth of the semiconductor layer sequence. In other words, each of the quantum wells is arranged in a layer or a layer is formed by the quantum wells, wherein these layers are oriented perpendicular to the growth direction and follow each other in the growth direction. Preferably, further layers of the semiconductor layer sequence lie between adjacent quantum wells or layers formed by the quantum wells so that the quantum wells or the layers formed thereby do not follow each other directly. Hereinafter, the terms "quantum wells" and the "layer" formed by the quantum wells are used synonymously.

In accordance with at least one embodiment of the semiconductor layer sequence, this includes a plurality of barrier layers. At least one of the barrier layers is located between two adjacent quantum wells in each case. It is possible that precisely one of the barrier layers is located between two adjacent quantum wells in each case and that the barrier layers each directly adjoin one or two of the adjacent quantum wells.

In accordance with at least one embodiment of the semiconductor layer sequence, the quantum wells have a first average indium content and the barrier layers have a second average indium content. "Average indium content" can mean that the indium content is averaged over the corresponding barrier layer or the corresponding quantum well, or even that the indium content is averaged over all quantum wells and/or all barrier layers, or that the indium content is averaged over all identically formed quantum wells and/or barrier layers. The first average indium content of the quantum wells is in this case higher than the second average indium content of the barrier layers.

In accordance with at least one embodiment of the semiconductor layer sequence, the barrier layers have a second average lattice constant and the quantum wells have a first average lattice constant. The same considerations as given above with respect to the averaging of the indium content are applicable for the averaging of the lattice constants. The first average lattice constant of the quantum wells is in this case higher than the second average lattice constant of the barrier layers. In other words, bracing is set between the quantum wells and the barrier layers.

In at least one embodiment, the semiconductor layer sequence is provided for an optoelectronic semiconductor chip. The semiconductor layer sequence contains at least three quantum wells which are arranged to generate electromagnetic radiation and which are arranged one above the other in a direction of growth of the semiconductor layer sequence. Furthermore, the semiconductor layer sequence comprises a plurality of barrier layers, of which at least one is arranged between two adjacent quantum wells in each case. The quantum wells have a first average indium content and the barrier layers have a second, smaller, average indium content. A second average lattice constant of the barrier layers is thereby lower than a first average lattice constant of the quantum wells.

A wavelength of radiation emitted by a light-emitting diode, for example, changes when the temperature of the light-emitting diode changes. For example, in the spectral range around 615 nm, this change measures approximately 0.1 nm/K. If light-emitting diodes of different colours are used together in combination, then a mixed colour produced by the light-emitting diodes can change when the temperature changes. This is undesired in many applications.

One possible way of solving this problem resides in obviating changes in temperature in the light-emitting diodes, for example by a comparatively costly cooling or heating of the light-emitting diodes. In this respect, sensors and/or control circuits are used for the temperature of the light-emitting diodes and/or for a colour or mixed colour emitted by the light-emitting diode.

By way of a targeted setting of bracings between the quantum wells and the barrier layers, the change in wavelength when the temperature changes can be reduced. These bracings are achieved in particular by different indium contents of the quantum wells and the barrier layers. Different lattice constants are associated with the different indium contents.

In particular in the case of non-braced InGaAlP, the barriers caused by the barrier layers are, relatively speaking, clearly higher for holes than for electrons. Likewise, the charge carriers, i.e., the electrons and the holes, are distributed in a non-uniform manner. As the temperature increases, this distribution improves, i.e., it becomes more uniform which, however, also results in a larger emission wavelength, associated with a lower amount of recombination energy.

A larger change in the wavelength is hereby brought about when the temperature changes than is produced by the crystal lattice of the semiconductor material per se. Growing a non-braced semiconductor layer sequence is generally simpler than growing a braced semiconductor layer sequence. However, by growing the braced semiconductor layer sequence, which is generally complicated, the temperature dependency of the emission wavelength of the semiconductor layer sequence can be reduced.

In accordance with at least one embodiment of the semiconductor layer sequence, this is based on $(Al_xGa_{1-x})_{1-y}In_yP$. In this case, $0 \leq x \leq 1$.

In accordance with at least one embodiment of the semiconductor layer sequence, the quantum wells satisfy the following condition: $0.51 \leq y \leq 0.7$ or $0.53 \leq y \leq 0.6$.

In accordance with at least one embodiment of the semiconductor layer sequence, the barrier layers satisfy the following condition: $0.3 \leq y \leq 0.49$ or $0.4 \leq y \leq 0.47$.

In accordance with at least one embodiment of the semiconductor layer sequence, the average indium content of the barrier layers differs from the average indium content of the quantum wells by at least 5 percentage points or by at least 10 percentage points or by at least 15 percentage points. In other words: $\Delta y \leq 0.05$ or $\Delta y \leq 0.10$ or $\Delta y \leq 0.15$, wherein $\Delta y = y_{quantum\ wells} - y_{barrier\ layers}$.

In accordance with at least one embodiment of the semiconductor layer sequence, the entire semiconductor layer sequence and/or the barrier layers and/or the quantum wells satisfy the following condition: $0.45 \leq x \leq 0.85$ or $0.50 \leq x \leq 0.80$. The following condition may be particularly valid for the quantum wells: $0 \leq x \leq 0.4$, and the following condition may be valid for the barrier layers: $0.4 \leq x \leq 1$.

In accordance with at least one embodiment of the semiconductor layer sequence, the barrier layers each have a thickness D3 and the quantum wells each have a thickness D2. It is possible for all barrier layers to have the same thickness D3 and for all quantum wells to have the same thickness D2. It is likewise possible for groups of barrier layers and/or groups of quantum wells to each have the same thicknesses D2 and D3 or for the quantum wells and/or the barrier layers to have different thicknesses from each other in pairs.

In accordance with at least one embodiment of the semiconductor layer sequence, the following condition is valid for the thickness D3 of one of the barrier layers with respect to the thickness D2 of the associated adjacent quantum well: 0.25 or 0.75 or 0.9 or 1.0 or 1.1 is less than or equal to D3/D2, and alternatively or in addition thereto 10.0 or 7.5 or 2.0 or 1.5 is greater than or equal to D3/D2, in particular $1.0 \leq D3/D2 \leq 2.0$. In other words, the barrier layers are preferably approximately the same thickness as or are thicker than the associated adjacent quantum wells in each case.

In accordance with at least one embodiment of the semiconductor layer sequence, this comprises at least two quantum wells which are arranged to generate electromagnetic radiation at mutually different wavelengths. The semiconductor layer sequence comprises for example at least two groups of quantum wells, each of the groups comprising quantum wells which are arranged to generate a particular wavelength. In other words, each of the groups is provided to generate radiation of a particular wavelength. Alternatively, it is possible that the quantum wells have a continuous or virtually continuous progression in the growth direction with respect to their emission wavelength.

The term "wavelength" is understood in this case to mean in particular that wavelength in an emission spectrum of the quantum wells at which a maximum radiated power is emitted, also known as Peak Wavelength.

In accordance with at least one embodiment of the semiconductor layer sequence, the quantum wells of a first group emit at the first wavelength $\lambda 1$ and the quantum wells of a second group emit at the second wavelength $\lambda 2$. In this case it is preferred that $\lambda 1 \leq \lambda 2$. Furthermore, it is preferred that the difference $\lambda 2 - \lambda 1 \leq 2$ nm or $\leq 3$ nm.

Furthermore, the difference $\lambda 2 - \lambda 1$ is preferably $\leq 15$ nm or $\leq 10$ nm or $\leq 8$ nm.

In accordance with at least one embodiment of the semiconductor layer sequence, the first group comprises a greater number of quantum wells than the second group. It is additionally possible that the first group of quantum wells emits more radiated power than the second group during normal operation of the semiconductor layer sequence. As a departure therefrom, it is also possible that the second group emits more radiated power or that the two groups emit approximately the same amount of radiated power.

In accordance with at least one embodiment of the semiconductor layer sequence, the groups of quantum wells are arranged successively in the growth direction. The quantum wells of the different groups are, in other words, not intermixed. No quantum well of one group is then located between quantum wells of another group.

In accordance with at least one embodiment of the semiconductor layer sequence, the first group is located closer to an n-side of the semiconductor layer sequence than the second group. The n-side is, in this case, that side of the semiconductor layer sequence which is connected to a cathode in normal use.

In accordance with at least one embodiment of the semiconductor layer sequence, the barrier layers and/or the quantum wells within one group are formed identically within manufacturing tolerances. Therefore, within one group, no specifically mutually different barrier layers and/or quantum wells are produced.

In accordance with at least one embodiment of the semiconductor layer sequence, this comprises at least two barrier layers which have mutually different thicknesses and/or mutually different material compositions. Of these barrier layers, each one is located between two adjacent quantum wells. An emission wavelength of the quantum wells can be adjusted by way of differently formed barrier layers between the quantum wells.

In accordance with at least one embodiment of the semiconductor layer sequence, the barrier layers which are located closer to the n-side have a larger barrier height than the barrier layers on a p-side which is provided for electrical contacting an anode during normal use of the semiconductor layer sequence. A reduction in the barrier height from the n-side to the p-side can be effected step-wise or continuously. By way of a barrier height increasing in this manner, it is possible that quantum wells close to the n-side are filled by holes only at a higher temperature, e.g., after or during heating of the semiconductor layer sequence after start-up.

In accordance with at least one embodiment of the semiconductor layer sequence, a ratio $E_B/\lambda$ increases monotonically in the growth direction and in the direction away from the n-side. $E_B$ is in this case the barrier height of the respective barrier layer and $\lambda$ is the wavelength, the quantum well respectively associated with the adjacent barrier layer being arranged to emit at this wavelength. In other words, the ratio $E_B/\lambda$ relates to pairs of barrier layers and associated quantum wells. A value of this product determined from the pairs of a barrier layer and an adjacent quantum well is thus, in the direction away from the n-side, greater or remains identical in sections.

In accordance with at least one embodiment, the semiconductor layer sequence is arranged to emit electromagnetic radiation in normal use, wherein a wavelength of this radiation is at least 550 nm or at least 595 nm or at least 600 nm and/or the wavelength is at the most 1100 nm or at the most 700 nm or at the most 625 nm or at the most 620 nm.

In accordance with at least one embodiment of the semiconductor layer sequence, the quantum wells are compressively braced. This results in a change in the band structure above all in the conduction band and in a larger band offset in the conduction band. The transport properties of the charge carrier, i.e., the holes and the electrons, are thereby partly compensated for.

An optoelectronic semiconductor chip is also provided. The semiconductor chip comprises a semiconductor layer sequence as described in conjunction with one or more of the above-mentioned embodiments. Features of the semiconductor layer sequence are thus also disclosed for the semiconductor chip and vice versa.

In accordance with at least one embodiment, the semiconductor chip comprises a semiconductor layer sequence as described in conjunction with the above-mentioned embodiments. Furthermore, the semiconductor chip contains a substrate on which the semiconductor layer sequence is arranged. The substrate can be a growth substrate on which the semiconductor layer sequence is epitaxially produced, or a carrier substrate which is different from the growth substrate.

In accordance with at least one embodiment of the semiconductor chip, the second average lattice constant of the barrier layers is smaller than an average substrate lattice constant of the substrate. Furthermore, the average lattice constant of the quantum wells is higher than the substrate lattice constant. In other words, the substrate lattice constant lies between the first lattice constant of the quantum wells and the second lattice constant of the barrier layers.

Furthermore, a method for producing a semiconductor layer sequence is provided. The method can be used to produce a semiconductor layer sequence as described in conjunction with one or more of the above-mentioned embodiments. Features of the semiconductor layer sequence and of the semiconductor chip are thus also disclosed for the method described herein and vice versa.

In at least one embodiment, the method comprises at least the steps of:
providing a growth substrate,
epitaxially and alternately growing at least three quantum wells and a plurality of barrier layers, wherein the quantum wells are provided for generating electromagnetic radiation and at least one of the barrier layers is grown between two adjacent quantum wells.

In this case, the quantum wells have a first average indium content and the barrier layers have a second, smaller, average indium content. The barrier layers have a second average lattice constant which is smaller than a substrate lattice constant of the growth substrate, wherein the quantum wells have a first average lattice constant which is higher than the substrate lattice constant.

The semiconductor layer sequence can be grown directly on the growth substrate. Alternatively, it is possible that an intermediate layer, for example a buffer layer, is provided on the growth substrate and that a lattice constant of the buffer layer is between the lattice constants of the quantum wells and the barrier layers.

In accordance with at least one embodiment of the method, the growth substrate is a GaAs substrate or a GaP substrate.

A semiconductor layer sequence described herein will be explained in more detail hereinafter with reference to the drawing using exemplified embodiments. Like reference numerals refer to like elements in the individual figures. However, the references are not illustrated to scale but rather individual elements may be illustrated excessively large for ease of understanding.

In the drawing:
FIGS. 1 and 2 show schematic sectional illustrations of exemplified embodiments of semiconductor layer sequences and semiconductor chips described herein, and
FIGS. 3 and 4 show schematic illustrations of a wavelength plot with the growth direction or with the temperature of exemplified embodiments of semiconductor layer sequences described herein.

FIG. 1 illustrates an exemplified embodiment of an optoelectronic semiconductor chip 10 having a semiconductor layer sequence 1 in a schematic sectional illustration. The semiconductor layer sequence 1 is applied on a substrate 5. For example, the semiconductor layer sequence 1 is epitaxially grown on the substrate 5, wherein the substrate 5 is then a growth substrate. A direction of growth G of the semiconductor layer sequence 1 points in a direction away from the substrate 5. Alternatively, the substrate 5 can be a carrier substrate which is only provided on the semiconductor layer sequence 1 once it is grown. An n-side n of the semiconductor layer sequence 1 faces towards the substrate 5, a p-side of the semiconductor layer sequence 1 faces away from the substrate 5. Alternatively, the n-side n and the p-side p can also be interchanged.

The semiconductor layer sequence 1 comprises a plurality of quantum wells 2 and a plurality of barrier layers 3. At least one of the barrier layers 3 is located in each case between two adjacent quantum wells 2. The barrier layers 3 and the quantum wells 2 follow each other in an alternating manner in the growth direction G. All of the quantum wells 2 and all of the barrier layers 3 may be formed identically within manufacturing tolerances. The barrier layers 3 have a thickness D3. The quantum wells 2 have a thickness D2. The thickness D3 of the barrier layers 3 is preferably greater than or even approximately equal to the thickness D2 of the quantum wells. The thickness D2 of the quantum wells 2 is, as also the case in all other exemplified embodiments, preferably between 5 nm and 7 nm inclusive or between 3 nm and 9 nm inclusive.

Optionally, the semiconductor layer sequence 1 comprises an intermediate layer 4 which is located on the n-side n. The intermediate layer 4 is, for example, a buffer layer and/or a current expansion layer. Furthermore, the semiconductor layer sequence 1 can optionally contain a cover layer 6. For example, the cover layer 6 is a current expansion layer and/or a coating layer. The cover layer 6 and the intermediate layer 4 can each be composed of a plurality of individual layers.

An indium content of the barrier layers 3 is lower than an indium content of the quantum wells 2. As a result, the barrier layers 3 and the quantum wells 2 have mutually different lattice constants, in particular in lateral directions perpendicular to the growth direction G. The barrier layers 3 and the quantum wells 2 are thus braced with respect to each other.

By way of this bracing, the temperature dependency of electromagnetic radiation generated by the semiconductor layer sequence 1 during operation is reduced compared with non-braced quantum well structures. By way of the bracing of the quantum wells, mobility of the holes is increased. At low temperatures, the quantum well located closest to the p-side is hereby filled with holes to a comparatively small extent. Since the holes are distributed more uniformly as the temperature increases, the emitted wavelength thus changes to a lesser extent than with non-braced quantum well structures.

The semiconductor layer sequence 1 comprises, as in all other exemplified embodiments, preferably at least three or at least five or at least ten quantum wells 2. Furthermore, the semiconductor layer sequence 1 preferably comprises at the most 50 or at the most 100 or at the most 200 quantum wells 2.

A material composition of the barrier layers 3 is preferably adapted such that barrier energy $E_B$ remains constant or becomes higher relative to emission energy of the adjacent quantum well 2 in the growth direction G.

FIG. 2 illustrates a further exemplified embodiment of the optoelectronic semiconductor chip 1 having the semiconductor layer sequence 1. The semiconductor layer sequence 1 comprises a plurality of quantum wells 2a, 2b. The identically formed quantum wells 2a are arranged in a first group and the mutually identically formed quantum wells 2b are combined to form a second group. The first group preferably comprises more quantum wells 2a than the second group's quantum wells 2b. The second group follows the first group in the growth direction G. The barrier layers 3a, 3b of the two groups can likewise each be formed identically within the groups in terms of thickness and material composition.

The quantum wells 2a are arranged to emit radiation at a smaller wavelength during operation of the semiconductor chip 10 than the quantum wells 2b of the second group. A wavelength difference between the emission wavelengths of the two groups is, for example, between 3 nm and 6 nm inclusive.

It is possible that the barrier layers 3a of the first group are formed differently from the barrier layers 3b of the second group. Alternatively, all barrier layers 3a, 3b can be formed identically. Furthermore and alternatively, it is possible that the quantum wells 2a, 2b of the two groups do not differ from each other in terms of their structure but rather that displacement of the emission wavelengths of the two groups is achieved by virtue of the fact that the barrier layers 3a, 3b of the groups are formed in a mutually different manner.

The semiconductor layer sequence 1 is based in particular on AlGaInP. The substrate 5 can be a GaAs substrate. The barrier layers 3 can be different from each other in terms of their thickness and also their contents of Ga, Al and In. Within the semiconductor layer sequence 1, an In content of the quantum wells 2 preferably varies by at the most 5 percentage points, in particular by at the most 2.5 percentage points. In other words, the In content of all quantum wells 2 is then at an average In content of the quantum wells 2 with a tolerance of ±2.5 percentage points or ±1.25 percentage points.

As the temperature of the semiconductor chip 10 increases, a proportion of holes on the n-side n increases. There is hereby a higher proportion of charge carrier recombination on the n-side n. This results in a shorter emission wavelength for the semiconductor layer sequence 1. In addition to the bracing between the quantum wells 2a, 2b and the barrier layers 3a, 3b, displacement of the wavelengths during changes in temperature which is on the whole smaller can hereby be achieved.

Owing to the braced quantum wells 2a, 2b based in particular on InGaAlP and the counter-braced InGaAlP barrier layers 3a, 3b, mobility of the electrons is lower and the holes have a greater mobility. In contrast, in the case of non-braced quantum well structures, the holes remain virtually completely on the p-side. Therefore, a semiconductor structure having non-braced quantum wells and/or barrier layers must then comprise barrier layers having smaller bandgaps or a lower number of quantum wells in order to achieve a uniform distribution of the holes.

FIG. 3 illustrates schematic progressions of an emission wavelength λ of the semiconductor layer sequence 1 with respect to the growth direction G. In accordance with FIG. 3A, the emission wavelength λ has a stepped progression with respect to the growth direction G. Such a wavelength progression can be achieved by means of a semiconductor layer sequence 1 for example in accordance with FIG. 2. In contrast to the illustrations of FIGS. 2 and 3A, more than two steps can also be formed in the wavelength progression and the semiconductor layer sequence 1 can then comprise more than two groups of quantum wells 2a, 2b.

Figure 3B:
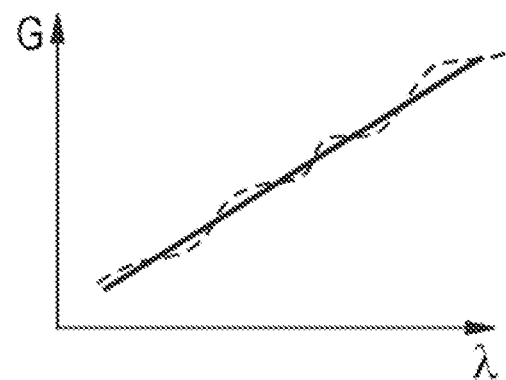
Figure 4:
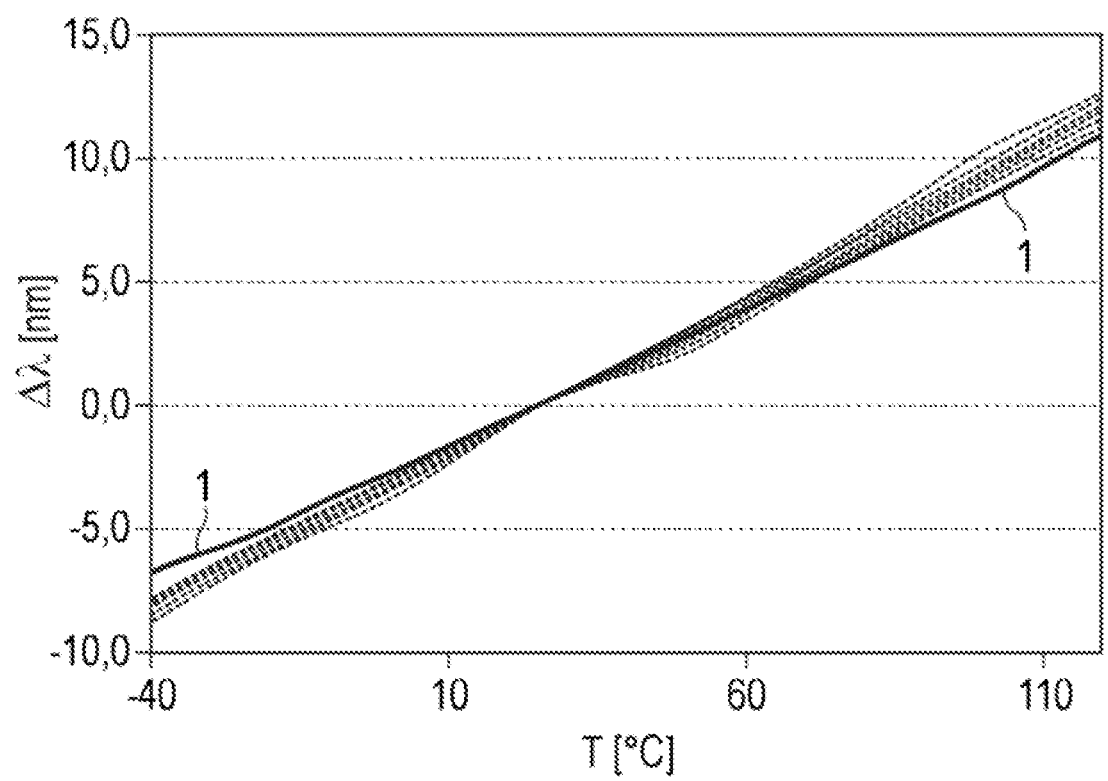

FIG. 3B illustrates that the emission wavelength λ changes linearly in the growth direction G. The term "linearly" does not exclude that the progression is only approximately linear and progresses with many small steps, wherein a jump in the wavelength λ between adjacent steps is then preferably smaller than 0.5 nm. Such an approximately linear progression is illustrated in FIG. 3B as a dashed line.

FIG. 4 schematically illustrates a change Δλ in the emission wavelength in nanometers with respect to temperature T in degrees Celsius. The emission wavelength in this case refers to a centroid wavelength. Compared with conventional semiconductor components, see the dashed line in FIG. 4, a progression of the wavelength dependency in a semiconductor layer sequence 1, e.g., as illustrated in FIG. 1, is smoother. In FIG. 4, the progression of the wavelength of the exemplified embodiment is shown as a solid line and is denoted by the reference numeral 1.

The invention described in this case is not limited by the description using the exemplified embodiments. Rather, the invention includes any new feature and any combination of features included in particular in any combination of features in the claims, even if this feature or this combination itself is not explicitly stated in the claims or exemplified embodiments.

This patent application claims the priority of German patent application 10 2011 115 312.1, the disclosure content of which is hereby incorporated by reference.

The invention claimed is:

1. Semiconductor layer sequence for an optoelectronic semiconductor chip having
    at least three quantum wells which are arranged to generate electromagnetic radiation and are arranged one above the other in a direction of growth of the semiconductor layer sequence,
    a plurality of barrier layers, of which at least one barrier layer is arranged between two adjacent quantum wells in each case,
    wherein
    the quantum wells have a first average indium content and the barrier layers have a second, smaller, average indium content,
    a second average lattice constant of the barrier layers is smaller than a first average lattice constant of the quantum wells,
    the indium content is averaged over all quantum wells and/or barrier layers, the semiconductor layer sequence is based on $(Al_xGa_{1-x})_{1-y}In_yP$, where $0<x\leq1$, wherein the quantum wells satisfy the condition: $0.51\leq y\leq0.7$, and the barrier layers satisfy the condition: $0.3\leq y\leq0.49$, and
    wherein the semiconductor layer sequence is arranged to generate radiation at a wavelength between 595 nm and 625 nm inclusive.

2. Semiconductor layer sequence according to claim 1, wherein the quantum wells satisfy the condition: $0.53\leq y\leq0.6$, and the barrier layers satisfy the condition: $0.4\leq y\leq0.47$.

3. Semiconductor layer sequence according to claim 1, wherein a thickness D3 of one of the barrier layers and a thickness D2 of the associated quantum well satisfy the condition: $0.75\leq D3/D2\leq7.5$.

4. Semiconductor layer sequence according to claim 1, wherein at least two of the quantum wells are arranged to emit radiation at mutually different wavelengths.

5. Semiconductor layer sequence according to claim 1, which comprises a plurality of quantum wells of a first group which are arranged to emit at a first wavelength $\lambda 1$, and which further comprises a plurality of quantum wells of a second group which are arranged to emit at a second wavelength $\lambda 2$, wherein $\lambda 1 < \lambda 2$ and $2\,nm \leq \lambda 2 - \lambda 1 \leq 15\,nm$ and the first group has a greater number of quantum wells than the second group, and wherein the groups are arranged successively in the growth direction and the first group is located closer to an n-side of the semiconductor layer sequence than the second group.

6. Semiconductor layer sequence according to claim 5, wherein the barrier layers within at least one of the groups of quantum wells are formed identically.

7. Semiconductor layer sequence according to claim 1, wherein at least two of the barrier layers, which are located between two adjacent quantum wells in each case, have mutually different thicknesses and/or mutually different material compositions.

8. Semiconductor layer sequence according to claim 7, wherein the barrier layers which are located closer to the n-side of the semiconductor layer sequence have a larger barrier height than the barrier layers on a p-side of the semiconductor layer sequence.

9. Semiconductor layer sequence according to claim 1, wherein a ratio $E_B/\lambda$ of the barrier heights $E_B$ of the barrier layers and the wavelengths $\lambda$—the respectively associated quantum wells being arranged to emit at this wavelength—increases monotonically in the growth direction and in the direction away from the n-side.

10. Optoelectronic semiconductor chip having
a semiconductor layer sequence according to claim 1, and
a substrate, on which the semiconductor layer sequence is arranged,
wherein the second average lattice constant of the barrier layers is smaller than an average substrate lattice constant of the substrate and the first average lattice constant of the quantum wells is higher than the substrate lattice constant.

11. Method for producing a semiconductor layer sequence for an optoelectronic semiconductor chip having
at least three quantum wells which are arranged to generate electromagnetic radiation and are arranged one above the other in a direction of growth of the semiconductor layer sequence,
a plurality of barrier layers, of which at least one barrier layer is arranged between two adjacent quantum wells in each case,
a plurality of quantum wells of a first group which are arranged to emit at a first wavelength $\lambda 1$, and
a plurality of quantum wells of a second group which are arranged to emit at a second wavelength $\lambda 2$,
wherein
the quantum wells have a first average indium content and the barrier layers have a second, smaller, average indium content,
a second average lattice constant of the barrier layers is smaller than a first average lattice constant of the quantum wells,
$\lambda 1 < \lambda 2$ and $2\,nm \leq \lambda 2 - \lambda 1 \leq 15\,nm$
the indium content is averaged over all quantum wells and/or barrier layers, the semiconductor layer sequence is based on $(Al_xGa_{1-x})_{1-y}In_yP$, where $0 \leq x \leq 1$, wherein the quantum wells satisfy the condition: $0.51 \leq y \leq 0.7$, and the barrier layers satisfy the condition: $0.3 \leq y \leq 0.49$,
the method comprising the steps of:
providing a growth substrate, and
epitaxially and alternately growing at least three quantum wells and a plurality of barrier layers, wherein the quantum wells are provided for generating electromagnetic radiation and at least one of the barrier layers is grown between two adjacent quantum wells, wherein
the quantum wells have a first average indium content and the barrier layers have a second, smaller, average indium content,
the barrier layers are grown with a second average lattice constant which is smaller than a substrate lattice constant of the growth substrate, and
the quantum wells are grown with a first average lattice constant which is higher than the substrate lattice constant.

12. Method according to claim 11, wherein the growth substrate is a GaAs substrate.

13. Semiconductor layer sequence for an optoelectronic semiconductor chip having
at least three quantum wells which are arranged to generate electromagnetic radiation and are arranged one above the other in a direction of growth of the semiconductor layer sequence,
a plurality of barrier layers, of which at least one barrier layer is arranged between two adjacent quantum wells in each case,
a plurality of quantum wells of a first group which are arranged to emit at a first wavelength $\lambda 1$, and
a plurality of quantum wells of a second group which are arranged to emit at a second wavelength $\lambda 2$,
wherein
the quantum wells have a first average indium content and the barrier layers have a second, smaller, average indium content,
a second average lattice constant of the barrier layers is smaller than a first average lattice constant of the quantum wells,
$\lambda 1 < \lambda 2$ and $2\,nm \leq \lambda 2 - \lambda 1 \leq 15\,nm$
the indium content is averaged over all quantum wells and/or barrier layers, the semiconductor layer sequence is based on $Al_xGa_{1-x})_{1-y}In_yP$, where $0 \leq x \leq 1$, wherein the quantum wells satisfy the condition: $0.51 \leq y \leq 0.7$, and the barrier layers satisfy the condition: $0.3 \leq y \leq 0.49$.

14. Semiconductor layer sequence according to claim 13, wherein
the first group of quantum wells has a greater number of quantum wells than the second group of quantum wells,
the groups are arranged successively in the growth direction,
the first group is located closer to an n-side of the semiconductor layer sequence than the second group, and
at least two of the barrier layers, which are located between two adjacent quantum wells in each case, have mutually different thicknesses and/or mutually different material compositions.

15. Semiconductor layer sequence according to claim 1, wherein the entire semiconductor layer sequence and/or the barrier layers and/or the quantum wells satisfy the following condition: $0.45 \leq x \leq 1$.

* * * * *